United States Patent [19]

Nakagawa et al.

[11] Patent Number: 5,275,661
[45] Date of Patent: Jan. 4, 1994

[54] DIPPING APPARATUS

[75] Inventors: Tadahiro Nakagawa; Shizuma Tazuke; Satoshi Omuro; Kiyoshi Yoshida; Nobuaki Kashiwagi; Takashi Kimoto, all of Kyoto, Japan

[73] Assignee: Murata Mfg. Co., Ltd., Japan

[21] Appl. No.: 848,258

[22] Filed: Mar. 9, 1992

[30] Foreign Application Priority Data

| Nov. 8, 1991 | [JP] | Japan | 3-321332 |
| Nov. 8, 1991 | [JP] | Japan | 3-321333 |
| Dec. 3, 1991 | [JP] | Japan | 3-347938 |

[51] Int. Cl.$^5$ ............................... B05C 3/00
[52] U.S. Cl. ................................ 118/425; 118/423; 118/500; 118/503
[58] Field of Search ............... 118/423, 500, 503, 425; 269/60, 61; 279/4.11, 141

[56] References Cited

U.S. PATENT DOCUMENTS

| 3,743,904 | 7/1973 | Wiesler et al. | 269/60 |
| 3,790,181 | 2/1974 | Scharfen | 279/4.11 |
| 4,306,731 | 12/1981 | Shaw | 279/4.11 |
| 4,383,494 | 5/1983 | Schillke et al. | 118/423 |
| 4,395,184 | 7/1983 | Braden | 414/417 |
| 4,664,943 | 5/1987 | Nitta et al. | 427/58 |
| 4,672,589 | 6/1987 | Vatzov et al. | 269/60 |
| 4,673,566 | 3/1986 | Roman | 269/60 |
| 4,788,931 | 12/1988 | Nitta et al. | 118/503 |
| 4,859,498 | 8/1989 | Yamaguchi | 118/500 |
| 4,869,202 | 9/1989 | Baker | 118/425 |
| 4,958,588 | 9/1990 | Hutchison et al. | 118/423 |

FOREIGN PATENT DOCUMENTS

3-44404  7/1991  Japan .

*Primary Examiner*—W. Gary Jones
*Assistant Examiner*—Brenda Lamb
*Attorney, Agent, or Firm*—Ostrolenk, Faber, Gerb & Soffen

[57] ABSTRACT

A chucking portion (10) is supported at the lower part of a dip head portion (2) to be vertically movable in a horizontal state through four shafts. Two diagonally positioned two shafts 11a, 11b are formed by ball screws, and the other two (11c, 11d) serve as guide shafts. The dip head portion (2) contains a motor (12) for synchronously driving the two ball screws, and the chucking portion (10) horizontally engages a holding plate (A) holding a number of chip type electronic components (B) to downwardly direct the same. A dipping vessel (7) having a bottom surface which is coated with a thin film of paste is horizontally arranged under the dip head portion (2). Thus, it is possible to maintain the holding plate in parallel with the paste, for applying electrodes to the chip type electronic components with high accuracy.

10 Claims, 10 Drawing Sheets

DIPPING APPARATUS

BACKGROUND OF THE INVENTION

1. Field of the Invention

The present invention relates to a dipping apparatus, which can apply paste onto the ends of miniature components such as chip type electronic components with high accuracy.

2. Description of the Background Art

In general, a holding plate having a number of receiving holes is employed for efficiently applying electrodes to end portions of a number of chip type electronic components, as disclosed in U.S. Pat. No. 4,395,184. This holding plate comprises a hard substrate, a thin flat plate portion which is formed at a central portion of the substrate to be provided with a number of through holes, and a rubber-like elastic member which is embedded in a concave portion defined in the flat plate portion to be provided with receiving holes. The receiving holes pass through the elastic member and are smaller in diameter than the through holes. The holding plate elastically holds chip type electronic components in the receiving holes to partially project the same, so that electrode paste of silver or the like is uniformly applied to the projected portions. Thereafter the chip type electronic components are heated to dry the electrode paste.

The aforementioned U.S. Pat. No. 4,395,184 describes an exemplary method of applying electrode paste to such chip type electronic components with a roller. In this method, a holding plate holding chip type electronic components to partially project the same from its upper surface is carried by a conveyor, and a roller which is coated with electrode paste on its peripheral surface is brought into contact with the projected portions of the chip type electronic components to apply the electrode paste onto the chip type electronic components. In order to uniformly apply a thickness of the paste around the peripheral surface of the roller, a scraper is employed for scraping off the excess portion the paste while rotating the roller.

When the chip type electronic components are about 1.6 to 5.7 mm in length, for example, the electrodes have extremely small thicknesses of about 0.15 to 0.3 mm, which must be controlled with high accuracy. In the aforementioned method, however, the paste which is applied to the peripheral surface of the roller flows following rotation thereof, and hence the thickness of the paste is finely varied to cause dispersion in thickness of the electrodes which are formed on the chip type electronic components. Such dispersion may also be caused by vibration of the conveyor or fluctuation of the degree of horizontalness.

Japanese Patent Publication No. 3-44404 (1991) describes a method of coating the upper surface of a flat coating plate with a thin film of electrode paste and approaching a holding plate holding chip type electronic components to partially downwardly project the same to the coating plate for pressing the projected portions of the chip type electronic components against the coating plate, thereby applying the electrode paste to the chip type electronic components.

This method causes no such inconvenience as that described in the aforementioned method employing a roller. According to this method, the projected portions of the chip type electronic components are pressed against the bottom surface of the coating plate which is coated with the paste, whereby the projected portions of the chip type electronic components are prevented from dispersing in length and the electrode widths are uniformalized. However, a single holding plate generally holds thousands of chip type electronic components. An extremely strong reactive force acts on the holding plate when the chip type electronic components are pressed against the coating plate which is coated with the paste. Thus, the holding plate may be inclined to deviate from a parallel state with respect to the paste, or the, holding, plate itself may be deformed and its flatness deteriorated, leading to inferiority in accuracy durning application of the electrodes.

SUMMARY OF THE INVENTION

Accordingly, an object of the present invention is to provide a dipping apparatus which can maintain a holding plate holding chip type electronic components in parallel with paste, for applying electrodes to the chip type electronic components with high accuracy.

Another object of the present invention is to provide a dipping apparatus which can prevent a holding plate from deformation, ensuring its flatness.

In order to attain the aforementioned objects, the present invention provides a dipping apparatus comprising a dip head portion and a dipping vessel being horizontally arranged under the dip head portion and having a bottom surface which is coated with a thin film of paste. A chucking portion is vertically movably supported on the lower part of the dip head portion through at least two shafts. At least one of the shafts is formed by a ball screw which is driven by a motor. The chucking portion horizontally engages a holding plate, which holds a number of chip type electronic components to downwardly project the same.

Preferably the chucking portion is supported by four shafts, which are arranged in a rectangular manner. Two diagonally positioned shafts are formed by synchronously driven ball screws, while the other two diagonally positioned shafts serve as guide shafts for guiding the vertical movement of the chucking portion.

Preferably the holding plate is provided on its side end surfaces with chucking grooves, and the chucking portion is provided with a horizontal backing plate and chucking pawls which engage with the chucking grooves to press the upper surface of the holding plate against the backing plate.

Exemplary action of the chucking portion which is downwardly suspended from the dip head portion through ball screws is now described. When nuts which are fitted with the ball screws are rotated by a motor, the ball screws are moved in the axial direction. Thus, the chucking portion coupled to the lower ends of the ball screws is downwardly moved to press projected portions of chip type electronic components, being held by a holding plate, against the bottom surface of a dipping vessel which is coated with paste. Although reactive force acts on the holding plate at this time, it is possible to prevent inclination of the chucking portion, which is vertically supported by at least two shafts including the ball screws. Thus, the holding plate is regularly maintained in a horizontal state, whereby it is possible to uniformly apply electrodes onto the end portions of the chip type electronic components which are held by the holding plate.

According to the present invention, a motor and ball screws are employed as means providing the vertical movement of the chucking portion, whereby the speed of vertical movement can be freely adjusted by the motor, to reduce shock applied to the holding plate.

As to the arrangement of the shafts for vertically supporting the chucking portion, two ball screws and two guide shafts may be arranged in diagonal positions respectively so that the diagonally positioned ball screws are synchronously driven by the motor. Thus, it is possible to receive a reactive force which is caused upon dipping in a balanced manner, thereby further effectively preventing inclination of the chucking portion.

The holding plate itself is easily deformed by the reactive force which is caused upon dipping, since the same holds a number of chip type electronic components. When the back of the holding plate is surface-supported by a backing plate, the holding plate can be prevented from deformation caused by the reactive force, and its flatness is ensured. When the chucking portion is received in the chucking grooves which are provided in the side end surfaces of the holding plate, the chucking portion will not be downwardly projected beyond the holding plate, and the dipping operation can be carried out without hindrance.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
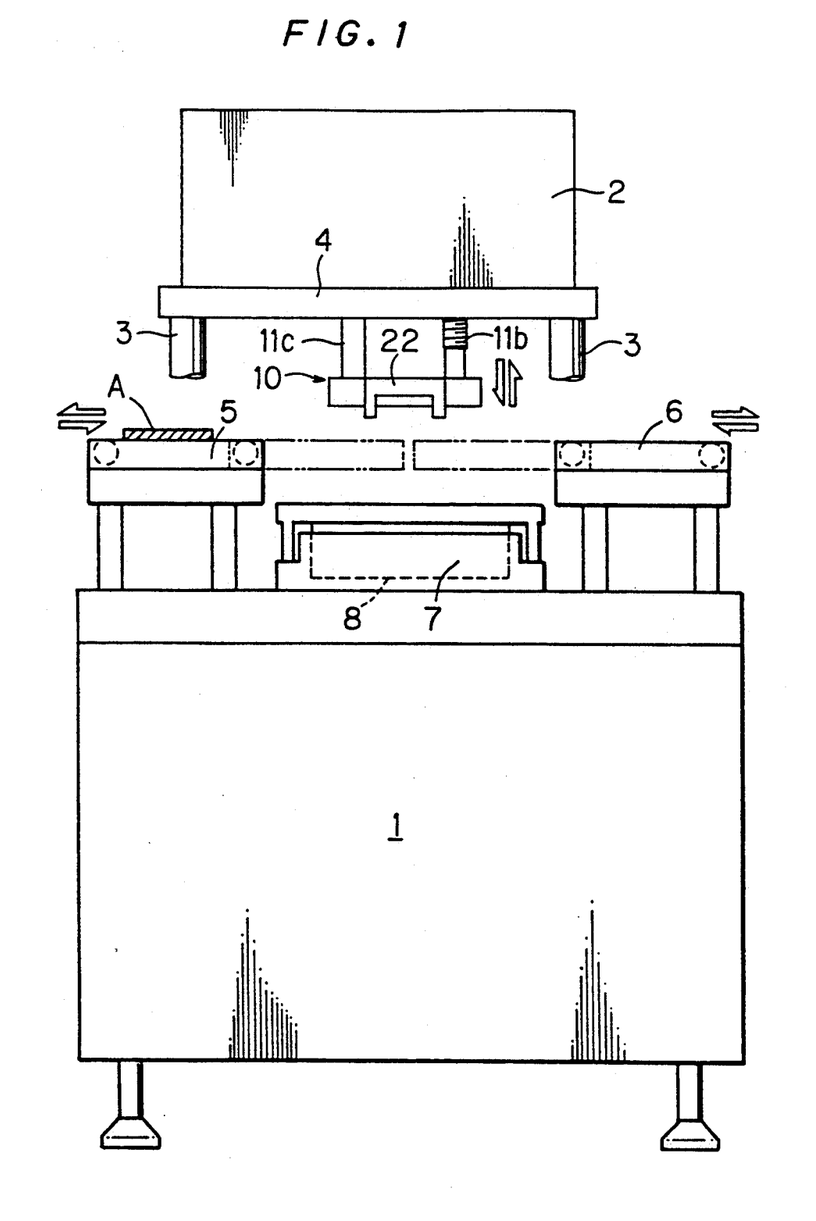
FIG. 1 is a front elevational view schematically showing a dipping apparatus according to an embodiment of the present invention.
Figure 2:
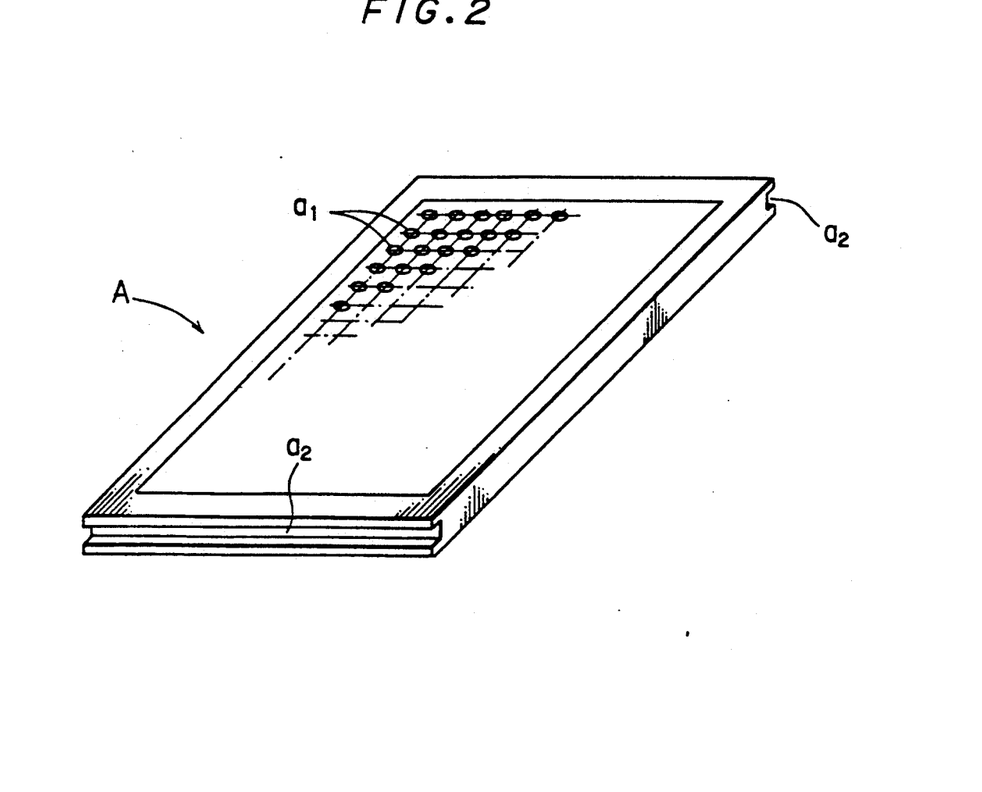
FIG. 2 is a perspective view of a holding plate which is employed in the dipping apparatus shown in FIG. 1.
Figure 3:
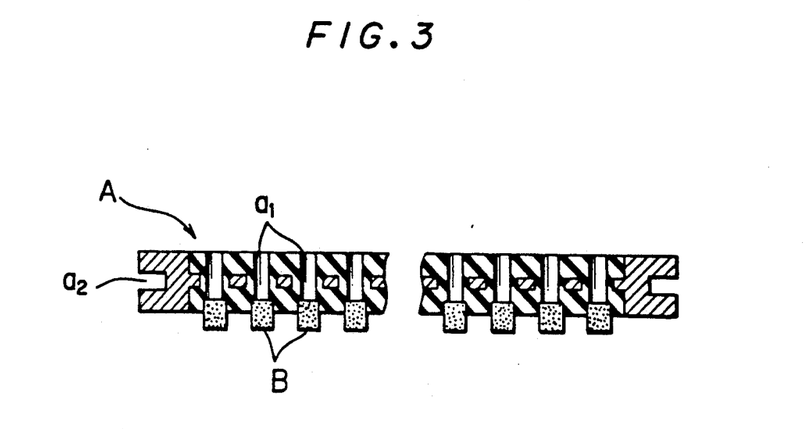
FIG. 3 is a cross-sectional view showing the holding plate holding chip type electronic components.

FIG. 1 shows a dipping apparatus according to an embodiment of the present invention, which is adapted to apply electrodes onto end portions of chip type electronic components B. As shown in FIGS. 2 and 3, the chip type electronic components B are elastically held by a holding plate A to be partially projected from receiving holes $a_1$. The structure of this holding plate A is similar to that disclosed in Japanese Patent Publication No. 3-44404 (1991).

The inventive dipping apparatus is formed by a body 1 which contains a control unit (not shown), a dip head portion 2 which is fixed onto the body 1 through fixed poles 3 and a top plate 4, a supply conveyor 5, a discharge conveyor 6, a dipping vessel 7, and a blade portion 8.

Figure 4:
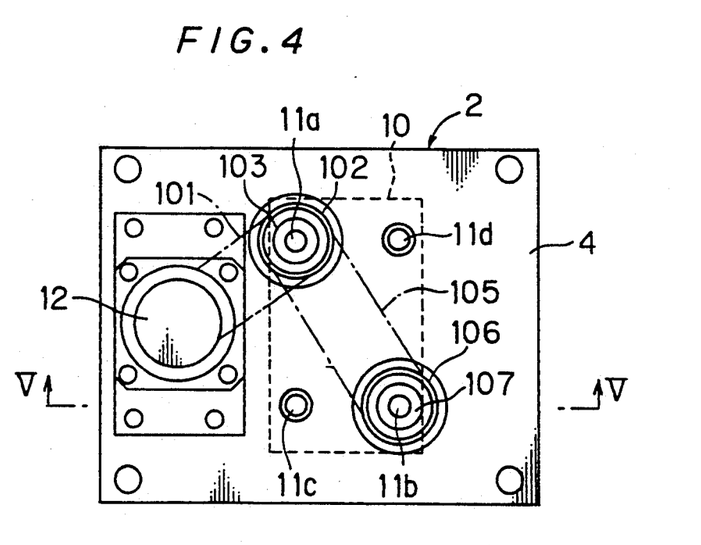
FIG. 4 is a plan view of a dip head portion which is included in the dipping apparatus shown in FIG. 1.
Figure 5:
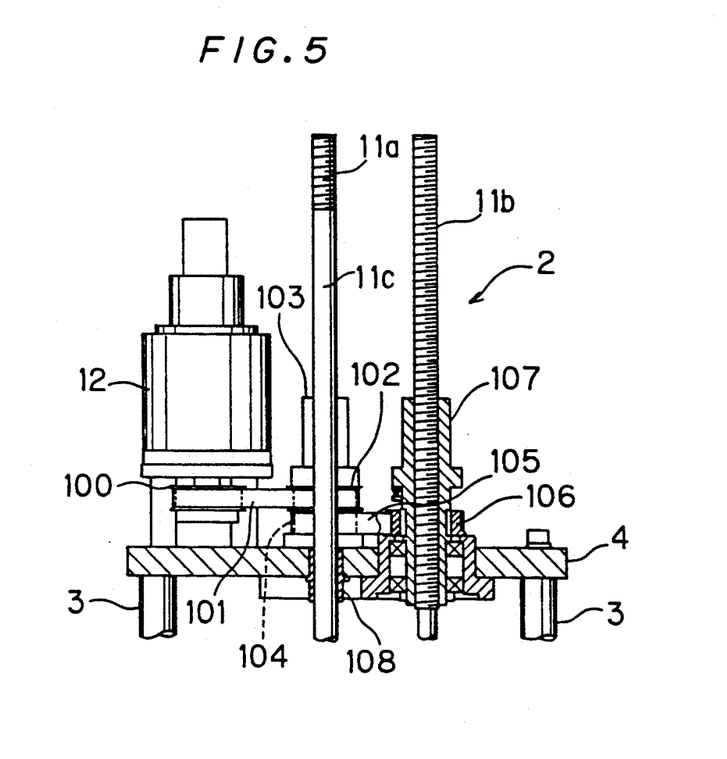
FIG. 5 is a cross-sectional view taken along the line V—V in FIG. 4.

As shown in FIGS. 4 and 5, a chucking portion 10 is vertically movably suspended from the lower part of the dip head portion 2 through four shafts 11a, 11b, 11c and 11d, which are arranged to define a rectangle about the center of gravity of the chucking portion 10. Two diagonally positioned shafts 11a and 11b are formed by ball screws, and the other diagonally positioned two shafts 11c and 11d serve as guide shafts. The guide shafts 11c and 11d are vertically slidably guided in the top plate 4 of the dip head portion 2 through guide bushes 108. The top plate 4 is provided thereon with a vertical motor 12 for rotating a nut 103 which is fitted with the first ball screw 11a through a pulley 100, a belt 101 and another pulley 102. The nut 103 rotates a nut 107 fitted with the second ball screw 11b through a pulley 104, which is integrally rotated with the pulley 102, a belt 105 and another pulley 106. Thus, the two ball screws 11a and 11b are driven in a synchronous manner. The chucking portion 10, which is thus supported by the four shafts 11a to 11d, can be vertically moved while regularly remaining in a horizontal state.

Figure 6:
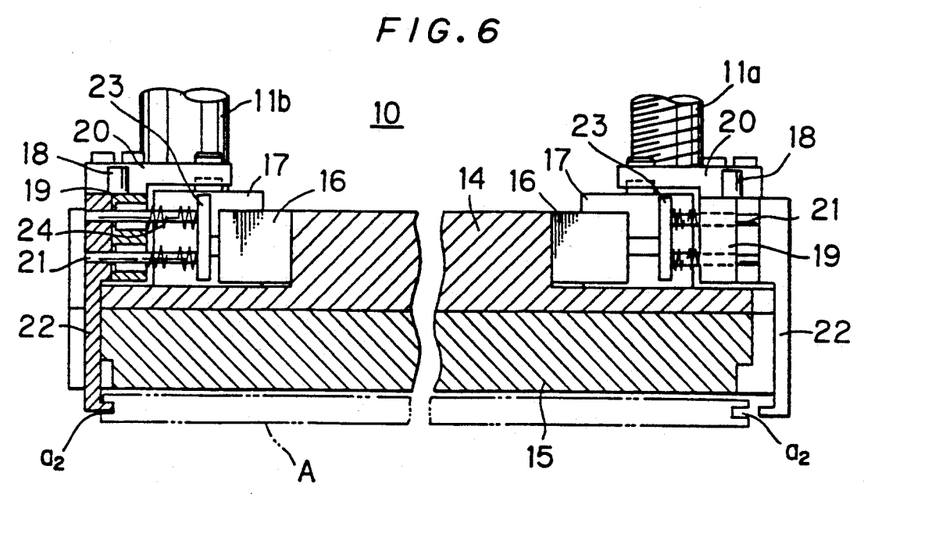
FIG. 6 is a sectional view of a chucking portion which is included in the dipping apparatus shown in FIG. 1.
Figure 7:
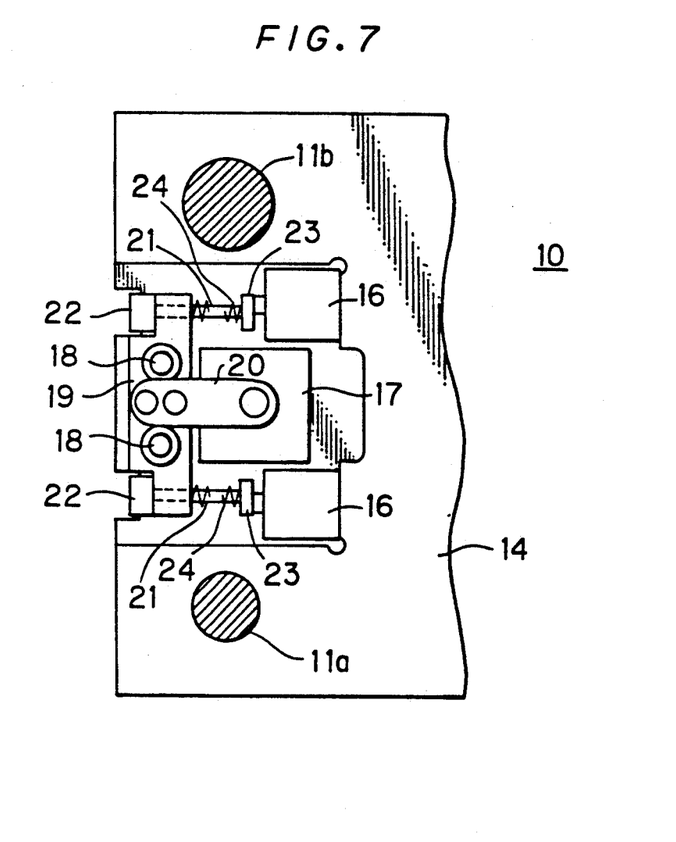
FIG. 7 is a partially fragmented plan view of the chucking portion shown in FIG. 6.

FIGS. 6 and 7 illustrate the chucking portion 10 in detail. Chucking 10 comprises a substrate 14 which is mounted on the lower end portions of the shafts 11a to 11d, and a backing plate 15 which is horizontally fixed to the lower side of the substrate 14. Two switching cylinders 16 and one vertical cylinder 17 are provided on each side of the substrate 14. A pair of sliding shafts 18 are fixed to the substrate 14 in upright states for guiding a vertically movable chuck holder 19, which is coupled to a piston rod of the vertical cylinder 17 through a stay 20. Thus, the chuck holder 19 is vertically movable through the vertical cylinder 17. Two pairs of sliding shafts 21 slidably pass through both side portions of the chuck holder 19, while a horizontal pair of chucking pawls 22 are coupled to outer end portions of the sliding shafts 21 and sliders 23 are fixed to side end portions of the sliding shafts 21 in vertically extending manners. Forward end surfaces of piston rods of the switching cylinders 16 are slidably in contact with side surfaces of the sliders 23. Contact pressures between the piston rods of the switching cylinders 16 and the sliders 23 are supplied by springs 24 which are provided on the sliding shafts 21.

In operation, the switching cylinders 16 outwardly open the chucking pawls 22 in a first stage, and the vertical cylinder 17 downwardly moves the opened chucking pawls 22 in a second stage. In a third stage, the switching cylinders 16 inwardly close the chucking pawls 22 to engage forward ends thereof with chucking grooves $a_2$, which are provided on both sides of the holding plate A. In a fourth stage, the vertical cylinder 17 upwardly moves the closed chucking pawls 22, to bring the upper surface of the holding plate A into close contact with the backing plate 15. Since the lower surface of the backing plate 15 is regularly maintained in a horizontal state by the shafts 11a to 11d, the holding plate A is also horizontally held to maintain the projected portions of the chip type electronic components B, which are received in the receiving holes $a_1$, in horizontal states. Referring to FIG. 6, the chucking pawls 22 provided on the left side are closed while those provided on the right side are opened.

In order to release the holding plate A, an operation reverse to the above is carried out. Namely, the chucking pawls 22 are moved downward in the closed states in a first stage to bring the holding plate A onto the conveyors 5 and 6 described hereafter, and the chucking pawls 22 are opened in a second stage to release the holding plate A. The opened chucking pawls 22 are moved upwardly in a third stage, and then inwardly closed in a fourth stage, to complete the series of operation.

Figure 8:
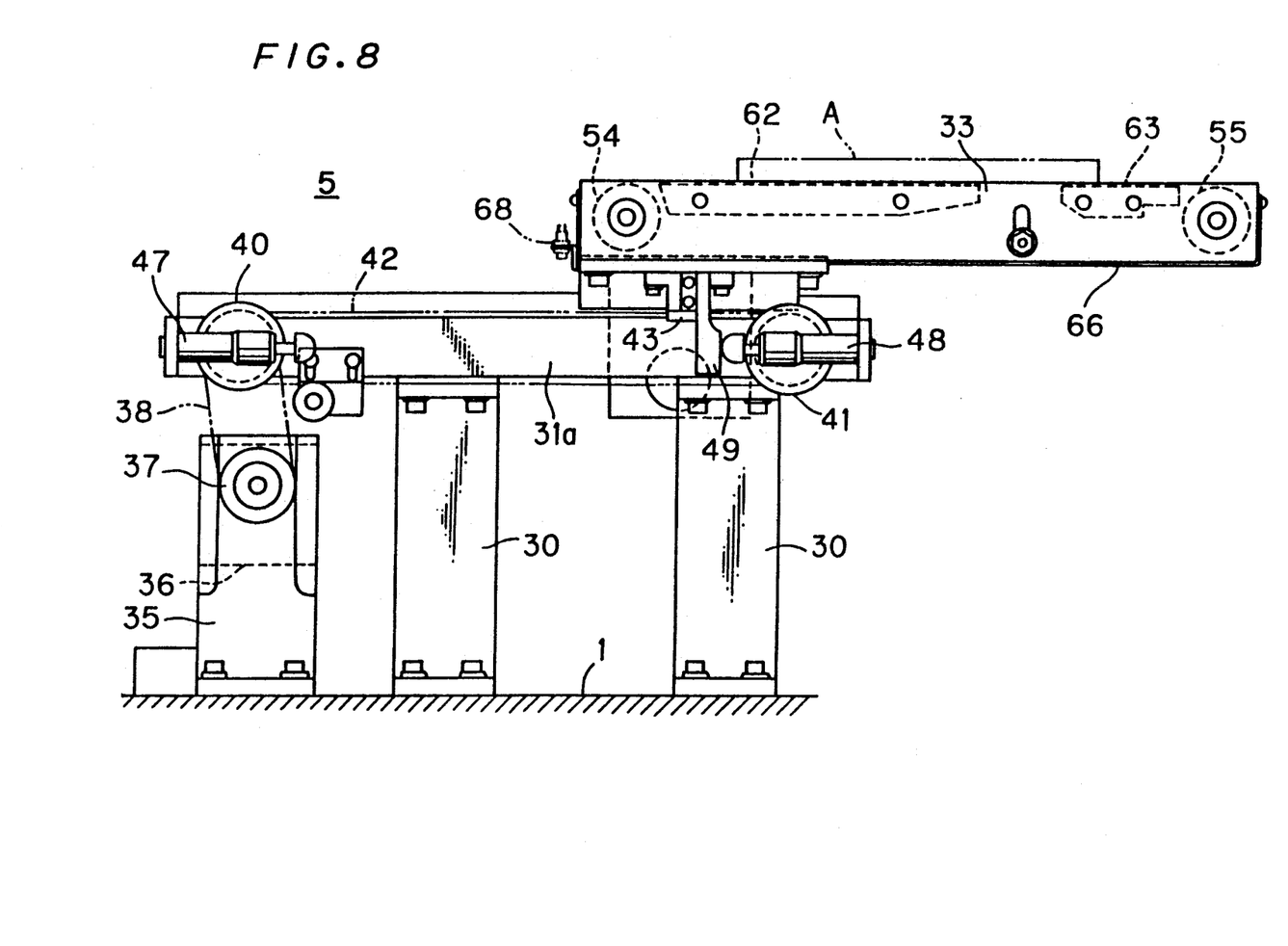
FIG. 8 is a front elevational view of a supply conveyor, which is included in the dipping apparatus shown in FIG. 1, located in a working position.
Figure 9:
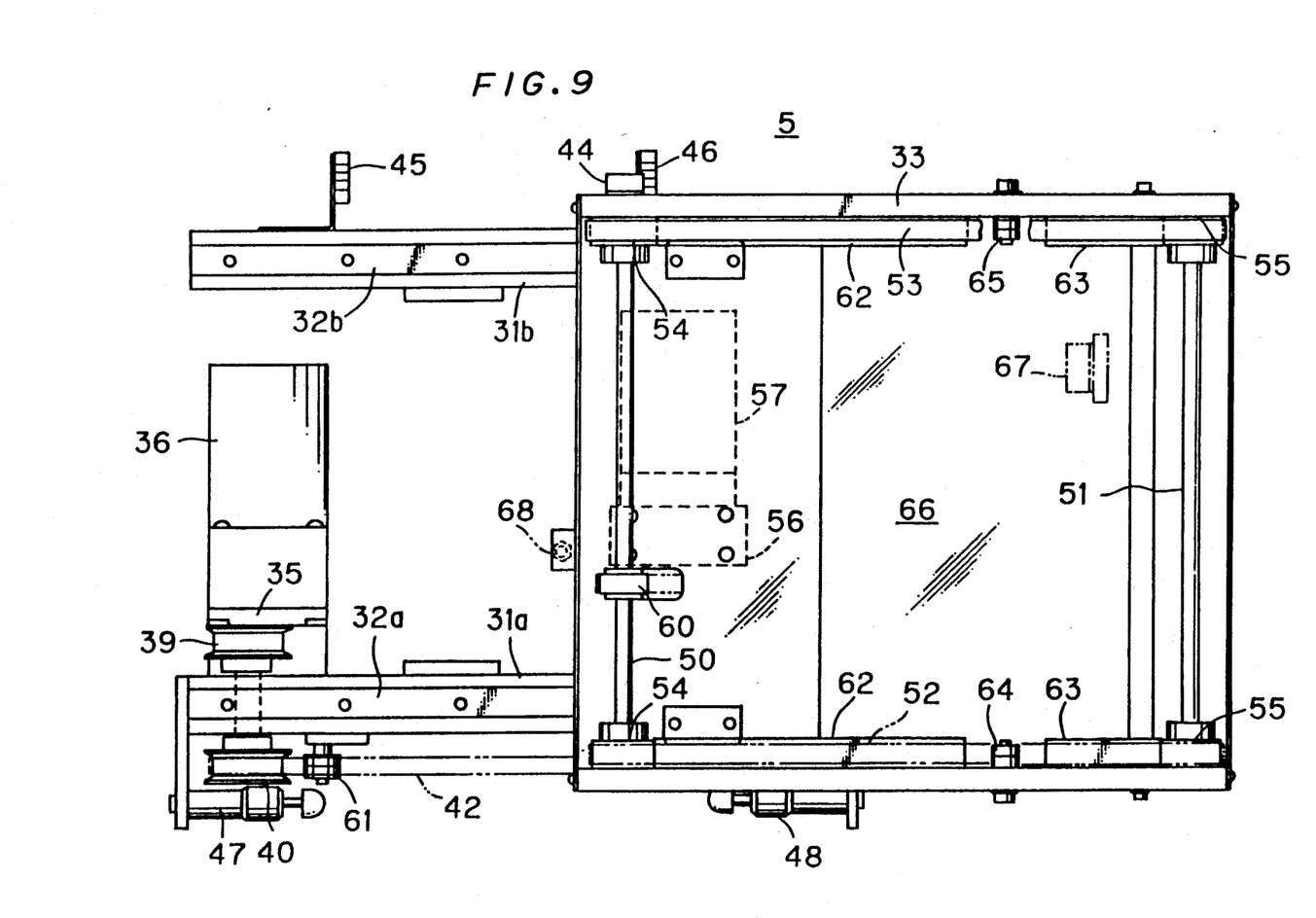
FIG. 9 is a plan view of the supply conveyor shown in FIG. 8.
Figure 10:
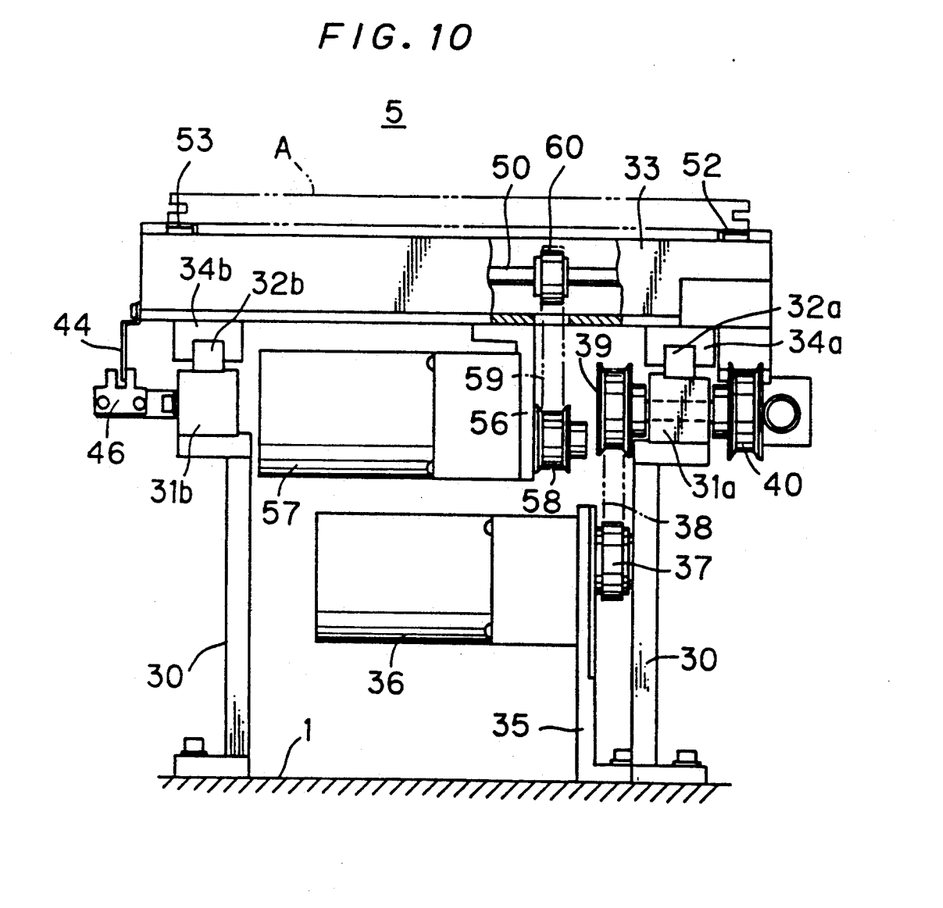
FIG. 10 is a left side elevational view of the supply conveyor shown in FIG. 8.

FIGS. 8 to 10 illustrate the supply conveyor 5 in detail.

Guide rails 32a and 32b are horizontally provided on a pair of supports 31a and 31b, each of which is horizontally fixed onto the body 1 through a plurality of support legs 30, so that a conveyor body 33 is slidable on the guide rails 32a and 32b through slide bearings 34a and 34b. A sliding motor 36 is fixed onto the body 1 through a bracket 35, and a driving pulley 37 is mounted on the rotary shaft of this motor 36. The driving pulley 37 is coupled in a power transmittable manner with an intermediate pulley 39, which is rotatably supported by a beginning end portion of the first support 31a, by a belt 38, and the intermediate pulley 39 is integrally rotated with a transmission pulley 40, which is located opposite pulley 39 across the support 31a. A sliding belt 42 extends across the transmission pulley 40 and another transmission pulley 41, which is rotatably supported by a terminal end portion of the support 31a, and a clamp member 43 for partially clamping the sliding belt 42 is provided on the lower surface of one side portion of the conveyor body 33. Thus, it is possible to horizontally slide the conveyor body 33 by driving the sliding motor 36.

A beginning end position (standby position) and a terminal end position (working position) of the conveyor body 33 in sliding operation can be detected when a detection member 44 provided on one side surface of the conveyor body 33 reaches position detectors 45 and 46, which are formed by photointerruptors mounted on the second support 31b at a constant space, respectively. The position detectors 45 and 46 output detection signals, to stop the sliding motor 36. In order to reduce shocks which may be caused when the conveyor body 33 is stopped at the beginning and terminal end positions, a pair of shock absorbers 47 and 48 are mounted on the first support 31a, and a stopper 49 is fixed to the side portion of the conveyor body 33 in response thereto.

Cross-directionally extending shafts 50 and 51 are rotatably supported at front and rear portions of the conveyor body 33, and carriage pulleys 54 and 55, which are horizontally provided with carriage belts 52 and 53, are mounted on both end portions of the shafts 50 and 51. The carriage belts 52 and 53 are adapted to support both side portions of the holding plate A. A carriage motor 57 is fixed to the lower surface of the conveyor body 33 through a bracket 56, and a driving pulley 58 is mounted on the rotary shaft of this motor 57. The driving pulley 58 interlocks with another pulley 60, which is mounted on an intermediate portion of the shaft 50, provided on the beginning end, through a belt 59. Thus, it is possible to drive the carriage belts 52 and 53 at the same speed by the carriage motor 57, to carry the holding plate A, which is supported on these belts 52 and 53, from the beginning end to the terminal end in a parallel manner.

The supply conveyor 5 further comprises a tension roller 61 for supplying constant tension to the sliding belt 42, a horizontal pair of guide plates 62 and 63 for slidably supporting the lower surfaces of the carriage belts 52 and 53, tension rollers 64 and 65 for supplying constant tension to the carriage belts 52 and 53, and a rear cover 66 for preventing the dipping vessel 7 from the droppage of dust etc. adhering to the carriage system.

Since the discharge conveyor 6 is symmetrical in structure to the supply conveyor 5, redundant description is omitted. The discharge conveyor 6 will be so synchronized in the sliding and carrying operation with the supply conveyor 5 that the discharge conveyor 6 is slid to the working, position in synchronization with the supply conveyor 5 and carriage belts of the discharge conveyor 6 are driven at the same speed in the same direction as those of the supply conveyor 5.

The discharge conveyor 6 differs in structure from the supply conveyor 5 through a photoelectric switch 67 and a proximity switch 68 mounted on an upper surface of a rear cover 66, which is provided on the bottom surface of a conveyor body 33, and beginning end side surface of the conveyor body 33 respectively for detecting positions of the holding plate A, as illustrated in FIG. 9. The photoelectric switch 67 is adapted to temporarily stop the holding plate A for carrying the same from the dipping step to a subsequent step, while the proximity switch 68 is adapted to decide a position for stopping the holding plate A when the same is supported across the conveyors 5 and 6, before dipping.

Figure 11:
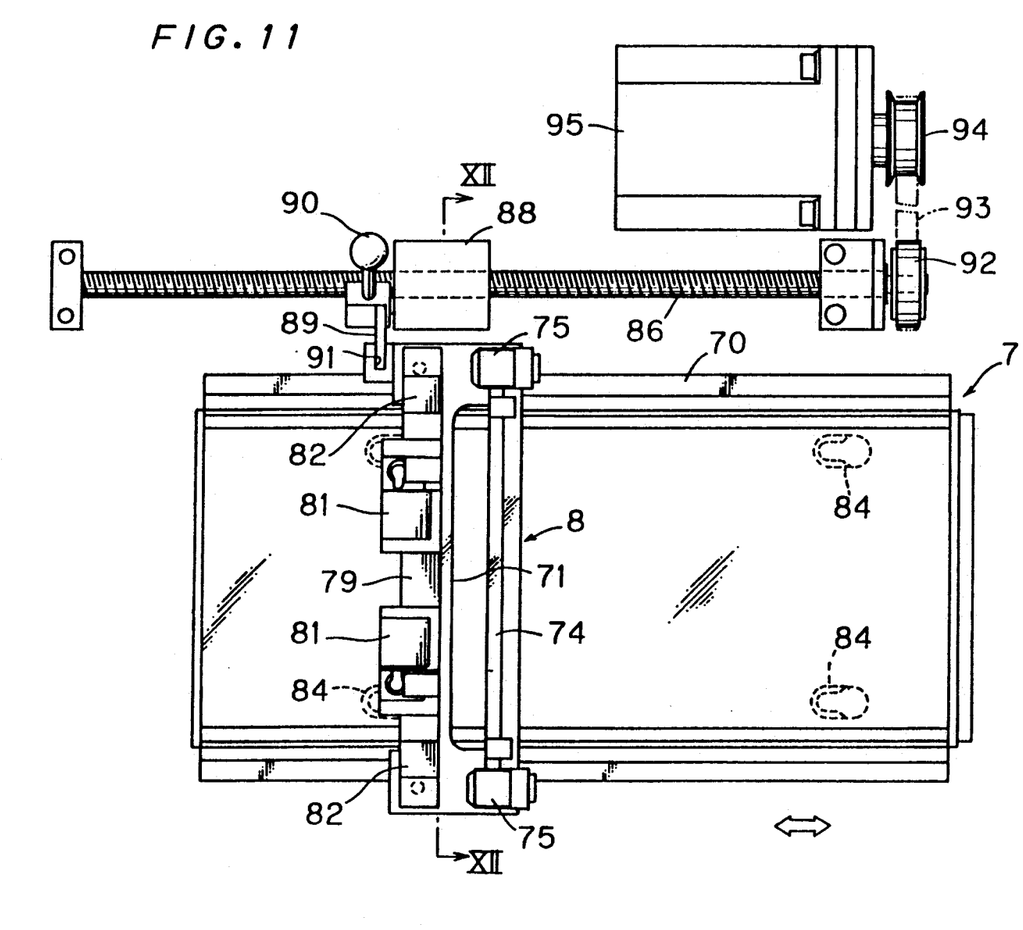
FIG. 11 is a plan view illustrating a dipping vessel and a blade portion which are included in the dipping apparatus shown in FIG. 1.
Figure 12:
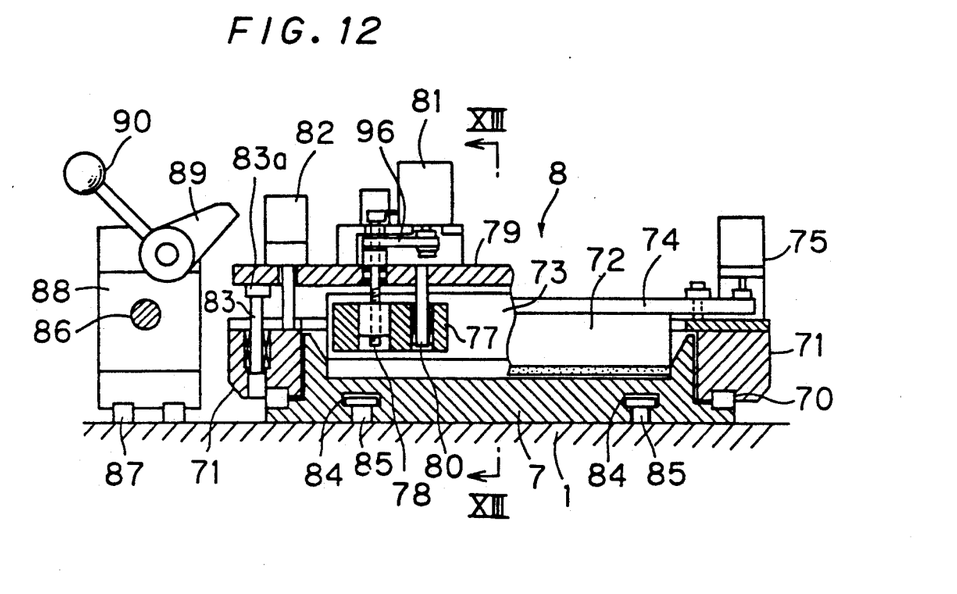
FIG. 12 is a cross-sectional view taken along the line XII—XII in FIG. 11.
Figure 13:
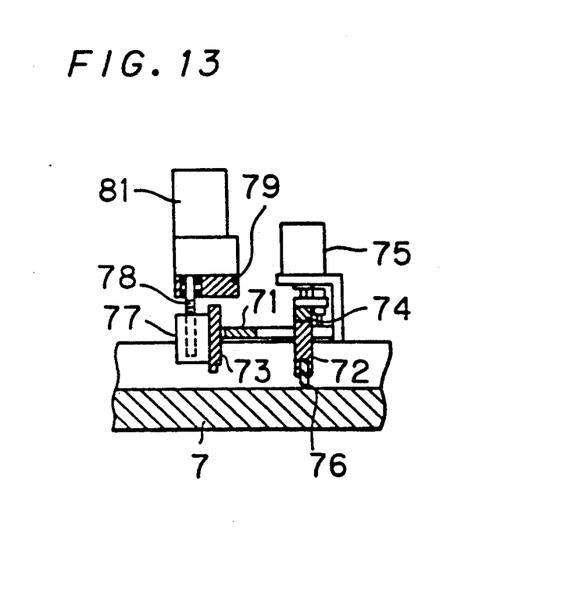
FIG. 13 is a cross-sectional view taken along the line XIII—XIII in FIG. 12.

FIGS. 11 to 13 illustrate the dipping vessel 7 and the blade portion 8.

The dipping vessel 7 is in the form of a rectangle having a U-shaped cross-sectional, which is slightly larger than the holding plate A, and includes guide rails 70 on both sides of longer edges thereof. A blade supporting frame 71 is slidably supported on the guide rails 70 to horizontally extend across the dipping vessel 7. A recovery blade 72 for collecting electrode paste on an end portion of the dipping vessel 7 and a levelling blade 73 for adjusting the electrode paste in a prescribed thickness are independently mounted on the blade supporting frame 71 in vertically movable manners. The blades 72 and 73 have the same widths, which are slightly smaller than the inner width of the dipping vessel 7 the shorter edges. The recovery blade 72 is fixed to the lower surface of a bridge bar 74, which is vertically movably supported on the upper portion of the blade supporting frame 71. Bridge bar 74 is vertically driven by a pair of cylinders 75, which are provided on both end portions of the blade supporting frame 71. A rubber blade member 76 is mounted on the lower end of the recovery blade 72, to be brought into close contact with the bottom surface of the dipping vessel 7.

A pair of blocks 77 are fixed to one side surface of the levelling blade 73, to be fitted with screw shafts 78 to slidably receive sliding shafts 80, whose upper end portions are fixed to a support plate 79. The screw shafts 78 rotatably pass through the support plate 79, and upper end portions thereof are driven by position control motors 81 through belts 96. Vertical cylinders 82 are fixed to horizontal end portions of the support plate 79, so that piston rods thereof are coupled to the blade supporting frame 71. Sliding shafts 83 are downwardly projected from both end portions of the support plate 79, to be vertically movably received in the blade supporting frame 71. Thus, it is possible to vertically move the support plate 79 in a horizontal manner with respect to the blade supporting frame 71 through a wide range by driving the vertical cylinders 82. Simultaneously while it is possible to finely control the vertical position of the levelling blade 73 with respect to the support plate 79 by driving the position control motors 81. The lower limit position of the support plate 79 is set by boss portions 83a of the sliding shafts 83, whereby it is possible to precisely set the height of the levelling blade 73 from the bottom surface of the dipping vessel 7. In other words, it is possible to precisely control the thickness of the electrode paste which is applied to the bottom surface of the dipping vessel 7.

Four mounting holes 84, each of which has a circular end and another end having a T-shaped longitudinal section, are formed in the lower surface of the dipping vessel 7, while four headed pins 85, corresponding to the mounting holes 84, upwardly protrude from the body 1. The dipping vessel 7 is so placed on the body 1 that the circular portions of the mounting holes 84 receive the heads of the headed pins 85 and slide rightwardly as shown in FIG. 11. Thus, the heads of the pins 85 are engaged in the T-shaped portions of the mounting holes 84, so that the dipping vessel 7 is held by the body 1 in close contact.

A ball screw 86 is arranged at the back of the dipping vessel 7 in parallel with a longer edge thereof, to be fitted with a nut member 88, which is slidable along guide rails 87 provided on the body 1. An engaging member 89 having a handle 90 is provided on the nut member 88, to be swingable about a shaft which is parallel to the ball screw 86. The engaging member 89 is driven by the handle 90 to swing toward the blade supporting frame 71, and is engaged with a receiving groove 91 which is formed in a rear end portion of the blade supporting frame 71, thereby coupling the nut member 88 with the blade supporting frame 71. A pulley 92 is mounted on a right side end of the ball screw 86. When the pulley 92 is driven by a motor 95 through a belt 93 and a pulley 94, the nut member 88 and the blade supporting frame 71 horizontally reciprocate in an integral manner.

An operation of the blade portion 8 is now described with reference to FIGS. 14(a) to 14(c).

Figure 14:
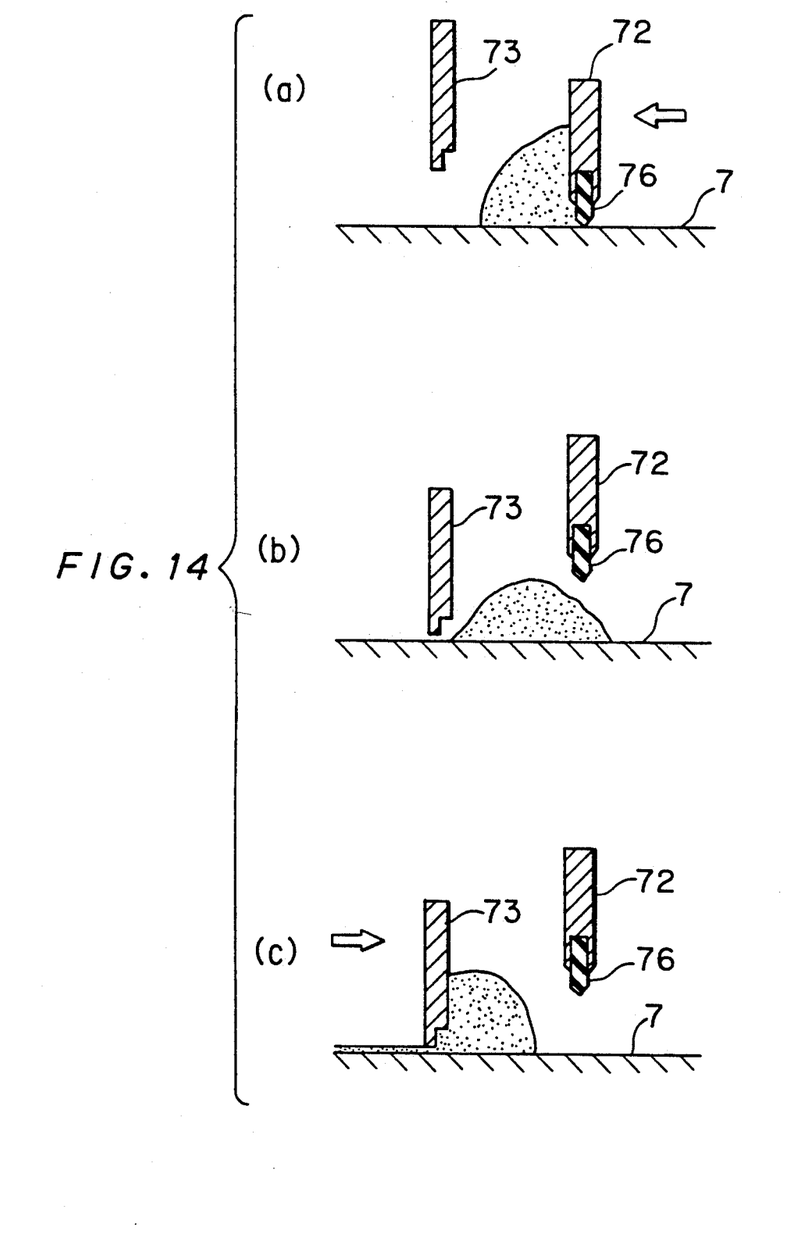
FIGS. 14(a) to 14(c) are explanatory diagrams for illustrating a method of applying paste.

First, the blade member 76 of the recovery blade 72 is pressed against the bottom surface of the dipping vessel 7 and the blade supporting frame 71 is driven leftwardly as shown in FIG. 14(a), thereby leftwardly collecting the electrode paste which is contained in the dipping vessel 7. Then, the recovery blade 72 moved upwardly and the levelling blade 73 approaches the bottom surface of the dipping vessel 7, as shown in FIG. 14(b). At this time, a bank of the paste which is collected by the recovery blade 72 is formed in a position in front of the levelling blade 73. Then, the levelling blade 73 is driven rightward as shown in FIG. 14(c), whereby a thin film of the electrode paste is formed on the bottom surface of the dipping vessel 7 in correspondence to the clearance between the end of levelling blade 73 and the dipping vessel 7. Thereafter the projected portions of the chip type electronic components B held by the holding plate A are brought into contact with the paste film, to be coated with electrodes.

A method of applying electrodes to the projected portions of the chip type electronic components B held by the holding plate A with the dipping vessel 7, which is coated with the thin film of electrode paste, is now described.

First, the forward ends of the chucking pawls 22 are inserted in the chucking grooves $a_1$ of the holding plate A holding the chip type electronic components B to downwardly direct the same, and the chucking pawls 22 are moved upward to bring the upper surface of the holding plate A into pressure contact with the backing plate 15. The backing plate 15 is previously strictly set to be in parallel with the bottom surface of the dipping vessel 7. The motor 12 is driven to move down the ball screws 11a and 11b, thereby downwardly moving the chucking portion 10 in a horizontal state. When the projected portions of the chip type electronic components B come into contact with the bottom surface of the dipping vessel 7, the chucking portion 10 is further moved slightly downward to press the chip type electronic components B into the receiving holes $a_1$. Thus, the projected portions of the chip type electronic components B are adjusted into constant lengths, to be provided with electrodes in uniform widths. At this time, the chucking pawls 22 are not in contact with the bottom surface of the dipping vessel 7 since the forward ends thereof are received in the chucking grooves $a_2$ of the holding plate A, and the dipping operation can be carried out without hindrance.

Since a single holding plate A generally holds thousands of chip type electronic components B, a strong reactive force acts on the holding plate A and the chucking portion 10 when the chip type electronic components B are pressed against the bottom surface of the dipping vessel 7, which is coated with the paste. Further, the level and action of such reactive force is varied with holding plates A. However, the chucking portion 10 is prevented from inclination since the same is supported by the diagonally arranged ball screws 11a and 11b and guide shafts 11c and 11d in a balanced manner. Further, the holding plate A is prevented from deformation since its upper surface is surface-supported by the backing plate 15. Thus, it is possible to accurately apply electrodes to the projected portions of the chip type electronic components B.

The speed of vertical movement, the stroke etc. of the chucking portion 10 can be arbitrarily changed by the motor 12. Thus, it is also possible to dip the chip type electronic components B in the electrode paste a plurality of times.

When the engaging member 89 is disengaged from the receiving groove 91 and the mounting holes 84 formed in the bottom surface of the dipping vessel 7 are separated from the pins 85 provided on the body 1, the dipping vessel 7 can be simply replaced by another vessel. In other words, it is possible to replace the paste by another type without removing the paste contained in the dipping vessel 7 and adhered to the blades 72 and 73, the exchange time can be significantly reduced. Since the dipping vessel 7 and the blades 72 and 73 are integrally handled when changing the paste, no deviation is caused in the positional relation which must be set with high accuracy between the bottom surface of the dipping vessel 7 and the levelling blade 73.

In this embodiment, the belts are formed by timing belts and the pulleys are formed by toothed pulleys. While all cylinders are formed by air cylinders, the same may alternatively be formed by solenoids. The motor 12 for vertically moving the chucking mechanism and the motor 95 for driving the blades are formed by servo motors, the sliding motor 36 and the carriage motor 57 are formed by reversible motors, and the blade control motors 81 are formed by stepping motors, respectively.

The present invention is not restricted to the aforementioned embodiment, but may be modified in various ways, as a matter of course. For example, the vertical motor 12 may not necessarily be adapted to rotate the nuts 103 and 107 which are fitted with the ball screws 11a and 11b for vertically moving the ball screws 11a and 11b, but such a motor may be driven to rotate the ball screws while the nuts which are fitted with the ball screws may be fixed to the chucking portion. The lower portions of the guide shafts 11c and 11d may be fixed to the chucking portion 10 so that the guide shafts 11c and 11d are slid with respect to the dip head portion 2. Alternatively, such guide shafts may be fixed to the dip head portion 2 so that the chucking portion 10 is slid with respect to the guide shafts. The motor 12 may be contained in the press body 1, in place, of the dip head portion 2.

Alternatively, the chucking portion may be supported by only two ball screws rather than the two ball screws and two guide shafts, and may arbitrarily be combined with guide shafts. Further, the two ball screws and two guide shafts are not restricted to the diagonal arrangement but may be arranged in any manner so far as the same can maintain the chucking portion in a horizontal state.

The chucking portion may not bring the holding plate into contact with its backing plate, but the same may engage the holding plate in any arbitrary manner.

According to the present invention, as hereinabove described, the chucking portion is vertically supported by at least two shafts including at least one ball screw, whereby it is possible to prevent the chucking portion from inclination caused by reactive force when the projected portions of the chip type electronic components held by the holding plate are pressed against the bottom surface of the dipping vessel which is coated with the paste. Thus, the holding plate is regularly maintained in a horizontal state, so that electrodes can be uniformly applied to ends of the chip type electronic components which are held by the holding plate.

Although the present invention has been described and illustrated in detail, it is clearly understood that the same is by way of illustration and example only and is not to be taken by way of limitation, the scope of the present invention being limited only by the terms of the appended claims.

What is claimed is:

1. A dipping apparatus for coating portions of chip type electronic components with a paste, comprising:
   a dip head portion;
   a dipping vessel horizontally disposed under said dip head portion, said dipping vessel having a bottom structured and arranged for receiving said paste; and
   a chucking portion supported on a lower part of said dip head portion in a vertically movable manner by four shafts, at least one of said four shafts being driven by a motor for vertically moving said chucking portion, and at least two of said four shafts comprising guide shafts for guiding the vertical movement of said chucking portion,
   said four shafts being arranged parallel to each other for maintaining said chucking portion parallel with said dip head portion,
   wherein said chucking portion is structured and arranged for engaging side end surfaces of a holding plate a number of said chip type electronic components to maintain said holding plate in a horizontal state and to downwardly direct said portions of said chip type electronic components for contacting said paste in order to be coated.

2. A dipping apparatus for coating portions of chip type electronic components with a paste, comprising:
   a dip head portion;
   a dipping vessel horizontally disposed under said dip head portion, said dipping vessel having a bottom structured and arranged for receiving said paste; and
   a chucking portion supported on a lower part of said dip head portion and vertically movable by four shafts diagonally positioned in a rectangular manner, two of the diagonally positioned shafts being synchronously driven shafts for vertically moving said chucking portion and the other two diagonally positioned shafts serving as guide shafts for guiding the vertical movement of said chucking portion;
   said two shafts being driven by a motor;
   wherein said chucking portion is structured and arranged for engaging side end surfaces of a holding plate holding a number of said chip type electronic components to maintain said holding plate in a horizontal state and to downwardly direct said portions of said chip type electronic components for contacting said paste in order to be coated.

3. A dipping apparatus in accordance with claim 1, wherein said side end surfaces of said holding plate are provided with chucking grooves, and said chucking portion includes a horizontal backing plate and chucking pawls for engaging with said chucking grooves to press an upper surface of said holding plate against said backing plate when said chucking portion is moved upward.

4. A dipping apparatus according to claim 1, further comprising a supply conveyor and a discharge conveyor horizontally disposed on either side of the chucking portion for supplying and removing a plurality of the holding plates.

5. A dipping apparatus in accordance with claim 2, wherein said two driven shafts are ball screws.

6. A dipping apparatus in according with claim 2, wherein said dip head portion includes a top plate, said guide shafts being vertically slidable in said top plate.

7. A dipping apparatus in accordance with claim 6, wherein said top plate supports the motor, and belt and pulley means for synchronously driving said two driven shafts.

8. A dipping apparatus in accordance with claim 3, wherein said chucking portion includes a substrate, said chucking pawls being supported by said substrate and said horizontal backing plate being fixed to a lower side of the substrate.

9. A dipping apparatus according to claim 8, wherein a chuck holder is vertically movable guided on each side of said substrate, one of said chucking pawls being horizontally slidably supported in each of said chuck holders.

10. A dipping apparatus in accordance with claim 1, wherein said driven shaft is a ball screw.

* * * * *